(12) United States Patent
Jiang et al.

(10) Patent No.: US 12,376,270 B2
(45) Date of Patent: Jul. 29, 2025

(54) DISPLAY DEVICE (71) Applicant: Xiamen Tianma Display Technology Co., Ltd., Xiamen (CN)

(72) Inventors: Wei Jiang, Xiamen (CN); Zhiwei Wang, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 226 days.

(21) Appl. No.: 18/109,860

(22) Filed: Feb. 15, 2023

(65) Prior Publication Data
US 2024/0179882 A1  May 30, 2024

(30) Foreign Application Priority Data
Nov. 29, 2022 (CN) .......................... 202211509779.0

(51) Int. Cl.
*G02F 1/33* (2006.01)
*G09F 9/30* (2006.01)
*H05K 7/20* (2006.01)

(52) U.S. Cl.
CPC ........... *H05K 7/20963* (2013.01); *G09F 9/30* (2013.01); *H05K 7/20509* (2013.01)

(58) Field of Classification Search
None
See application file for complete search history.

(56) References Cited

U.S. PATENT DOCUMENTS

| | | | | |
|---|---|---|---|---|
| 11,322,489 B2 * | 5/2022 | Huang | .................. | G09G 3/32 |
| 11,778,761 B2 * | 10/2023 | Shimoyama | ............ | G09F 7/002 |
| | | | | 361/807 |
| 11,803,005 B1 * | 10/2023 | Yang | ..................... | G02B 6/0085 |
| 2009/0040417 A1 * | 2/2009 | Nagaoka | ............. | G02F 1/33604 |
| | | | | 349/58 |
| 2011/0292682 A1 * | 12/2011 | Yu | ..................... | G02F 1/133382 |
| | | | | 362/609 |
| 2012/0281167 A1 * | 11/2012 | Nakatsuka | ........ | G02F 1/133615 |
| | | | | 165/185 |
| 2018/0317350 A1 * | 11/2018 | Dunn | ................ | G02F 1/133308 |
| 2018/0356686 A1 * | 12/2018 | Yeh | ..................... | G02F 1/33608 |
| 2019/0373719 A1 * | 12/2019 | Lee | ....................... | H05K 1/0203 |
| 2021/0124197 A1 * | 4/2021 | Wang | ................ | G02F 1/133305 |
| 2021/0167317 A1 * | 6/2021 | Fu | .......................... | H01L 25/167 |
| 2022/0201904 A1 * | 6/2022 | Park | ........................ | G06F 1/203 |
| 2022/0231211 A1 * | 7/2022 | Im | ......................... | H01L 25/167 |
| 2023/0021970 A1 * | 1/2023 | Lee | ........................ | H05K 5/03 |
| 2024/0313173 A1 * | 9/2024 | Meng | .................. | H10H 20/853 |
| 2024/0357880 A1 * | 10/2024 | Li | ............................. | G09F 9/30 |

\* cited by examiner

Primary Examiner — Xanthia C Relford
(74) Attorney, Agent, or Firm — Anova Law Group, PLLC (57) ABSTRACT

A display device includes a display panel, a structure to be dissipated, and a heat dissipation structure. The structure to be dissipated is located at one side of a backlight surface of the display panel, and heat dissipation structure is located at one side of the structure to be dissipated away from the display panel. The heat dissipation structure includes a first heat dissipation member and a second heat dissipation member, and the first heat dissipation member is connected to the second heat dissipation member through a first connection member. The first heat dissipation member and the second heat dissipation member at least partially overlap along a first direction perpendicular to a plane where the display panel is located. A first interval is between the first heat dissipation member and the second heat dissipation member in the first direction.

20 Claims, 8 Drawing Sheets

DISPLAY DEVICE

CROSS-REFERENCE TO RELATED APPLICATION

This application claims the priority to Chinese patent application No. 202211509779.0, filed on Nov. 29, 2022, the entirety of which is incorporated herein by reference.

TECHNICAL FIELD

The present disclosure relates to the technical field of display devices and, more particularly, to a display device.

BACKGROUND

With the development of display technology, display devices (such as mobile phones, tablets, wearable wristbands, televisions, etc.) have been widely used. Heat dissipation problem is an important problem that the display device has been facing. If heat dissipation effect of the display device is poor, internal temperature of the display device will be high. High temperature environment will affect normal operations of various electronic components inside the display device, which affects display effect of the display device. Also, the high temperature environment will affect service lives of the various electronic components and reduce service life of the display device.

SUMMARY

In accordance with the disclosure, there is provided a display device including a display panel, a structure to be dissipated, and a heat dissipation structure. The structure to be dissipated is located at one side of a backlight surface of the display panel, and heat dissipation structure is located at one side of the structure to be dissipated away from the display panel. The heat dissipation structure includes a first heat dissipation member and a second heat dissipation member, and the first heat dissipation member is connected to the second heat dissipation member through a first connection member. The first heat dissipation member and the second heat dissipation member at least partially overlap along a first direction perpendicular to a plane where the display panel is located. A first interval is between the first heat dissipation member and the second heat dissipation member in the first direction.

BRIEF DESCRIPTION OF THE DRAWINGS

In order to explain the technical solutions in the embodiments of the present disclosure more clearly, reference is made to the accompanying drawings, which are used in the embodiments of the present disclosure. Other drawings can be obtained from these drawings without any inventive effort for those of ordinary skill in the art.

REFERENCE NUMERALS

Display panel 1, Display member 11, Bending member 12, Binding member 13, Buffer layer 14, Support layer 15; Structure to be dissipated 2, First surface 21, Side surface 22; Heat dissipation structure 3, First heat dissipation member 31, Second heat dissipation member 32, First end 321, Second end 322, First connection member 33, Third heat dissipation member 34, Second connection member 35, Heat conduction material 36; First heat dissipation structure 3a, Second heat dissipation structure 3b, Third heat dissipation structure 3c; First bonding member 4, Bonding sub-member 41; Second bonding member 5; Support layer 6; Middle frame 7; Light emission surface M1, Backlight surface M2; Accommodation space A; Driver chip IC; First interval H1, Second interval H2; First direction X, Second direction Y.

DETAILED DESCRIPTION OF THE EMBODIMENTS

The features and exemplary embodiments of the present disclosure will be described in detail below. In order to make the objectives, technical solutions, and advantages of the embodiments of the present disclosure clearer, the present disclosure will be further described in detail below in combination with the accompanying drawings and specific embodiments. It should be understood that the specific embodiments described herein are only configured to explain the present disclosure rather than limit the present disclosure. The present disclosure can be implemented without some of these specific details for those skilled in the art.

The following description of the embodiments is only to provide a better understanding of the present disclosure by showing examples of the present disclosure.

It should be noted that relational terms such as first and second are only used herein to distinguish one entity or operation from another entity or operation, and do not necessarily require or imply any such actual relationship or order between these entities or operations. Also, the terms "include," "involve" or any other variations thereof are intended to cover non-exclusive inclusion, so that a process, method, object, or device including a series of elements not only includes those elements, but also includes other elements that are not explicitly listed, or also includes elements inherent to such processes, method, object, or device. Without further restrictions, the element associated with phrase "including . . . " does not exclude the existence of other identical elements in the process, method, object, or device that includes the element.

It has been noticed that in a high-temperature experiment on a high-resolution display device, the display device it easy to be burnt due to excessive temperature, which results in abnormal display. Through research, it is found that the reason is that some components inside the display device, such as structures of a driver chip and a back plate, will generate a lot of heat when the display device is working. Especially in a case of high resolution, where the driver chip needs stronger driving capability, power consumption is increased, so that heat generation is more intense, and even display effect of the display device is affected in severe cases, which results in abnormal display.

Figure 1:
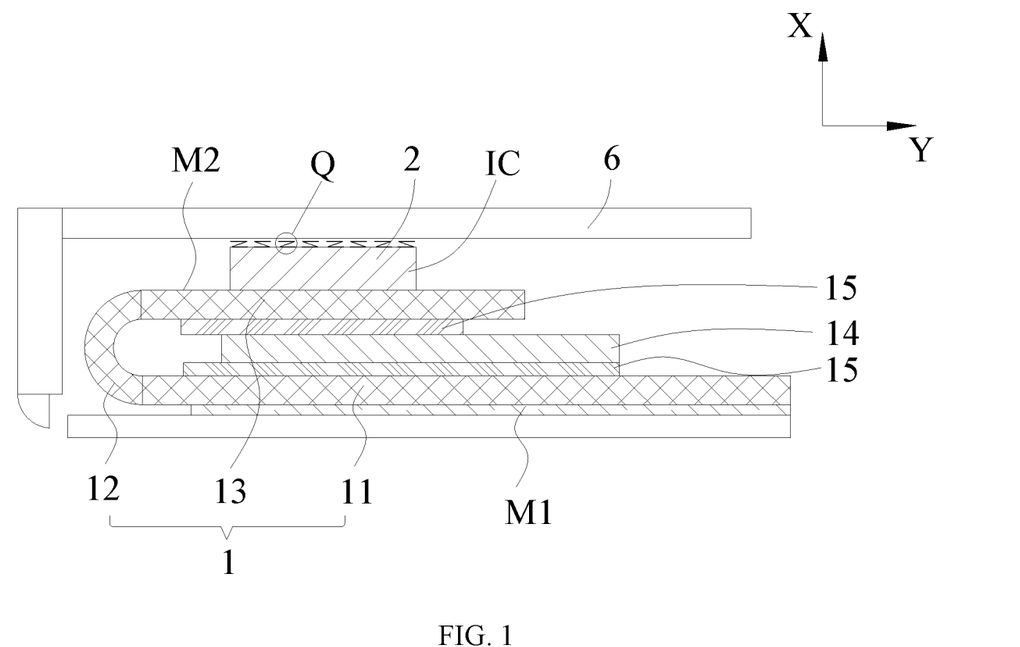
FIG. 1 is a schematic diagram of an internal structure of a display device according to an embodiment of the present disclosure.
Figure 2:
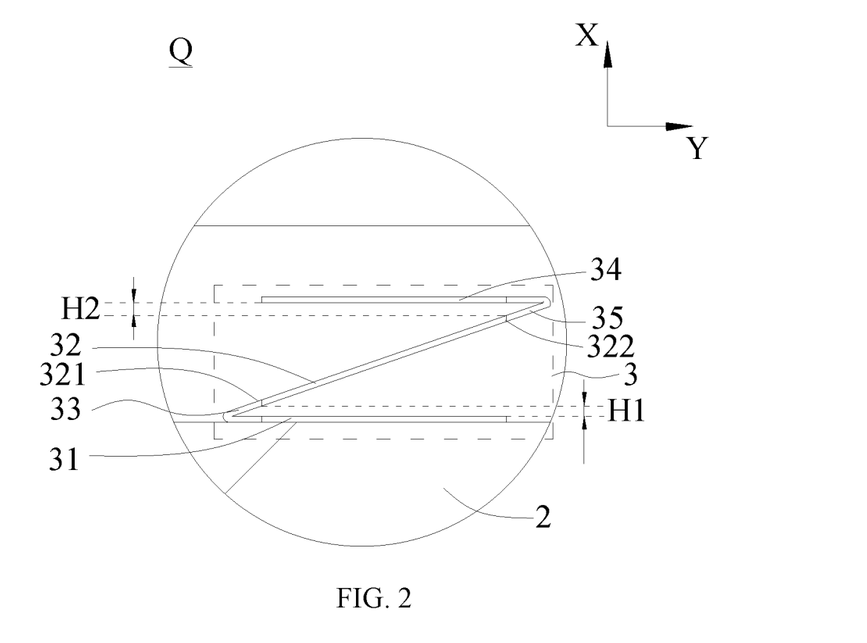
FIG. 2 is a partially enlarged schematic diagram of area Q in FIG. 1.

Referring to FIGS. 1 and 2, in order to solve the above problems, the present disclosure provides a display device, which includes a display panel 1, a structure to be dissipated 2, and a heat dissipation structure 3. The structure to be dissipated 2 is located at one side of a backlight surface M2 of the display panel 1, and the heat dissipation structure 3 is located at one side of the structure to be dissipated 2 away from the display panel 1.

The heat dissipation structure 3 includes a first heat dissipation member 31 and a second heat dissipation member 32, and the first heat dissipation member 31 is connected to the second heat dissipation member 32 through a first connection member 33. Along a first direction X, the first heat dissipation member 31 and the second heat dissipation member 32 at least partially overlap, and there is a first interval H1 between the first heat dissipation member 31 and the second heat dissipation member 32. The first direction X is perpendicular to a plane where the display panel 1 is located.

The display panel 1 is a functional component used in the display device to realize the display effect. The display panel 1 generally includes a variety of different film layers that are stacked. For example, the display panel 1 includes an array layer, a light emission layer, an encapsulation layer, a cover plate, etc. that are stacked.

The structure to be dissipated 2 is located at one side of the backlight surface M2 of the display panel 1, and the structure to be dissipated 2 may or may not be in contact with the display panel 1, which is not limited herein. When the display device is in use, the structure to be dissipated 2 will generate or transfer a lot of heat, so that even display effect of the display device is affected in severe cases, which results in abnormal display.

The specific position and structure of the structure to be dissipated 2 is not limited herein. For example, the structure to be dissipated 2 includes a back plate which is configured to support and protect the display panel 1. Heat generated by the display panel 1 will be transferred to the back plate, which causes temperature of the back plate to rise. As another example, the structure to be dissipated 2 includes a driver chip IC. When the display device is in use, the driver chip IC will generate a lot of heat, which causes temperature of the display device to rise, thereby easily resulting in abnormal display.

The heat dissipation structure 3 is configured to dissipate heat and cool down the structure to be dissipated 2. The heat dissipation structure 3 is located at one side of the structure to be dissipated 2 away from the display panel 1, which refers to that in a thickness direction of the display panel 1, part or all of the heat dissipation structure 3 and the display panel 1 are respectively located at two sides of the structure to be dissipated 2. The specific position of the heat dissipation structure 3 is not limited herein. For example, part of the heat dissipation structure 3 is located on at side of the structure to be dissipated 2 away from the display panel 1, and part of the heat dissipation structure 3 is arranged side by side with the structure to be dissipated 2 in a direction parallel to the display panel 1.

Figure 4:
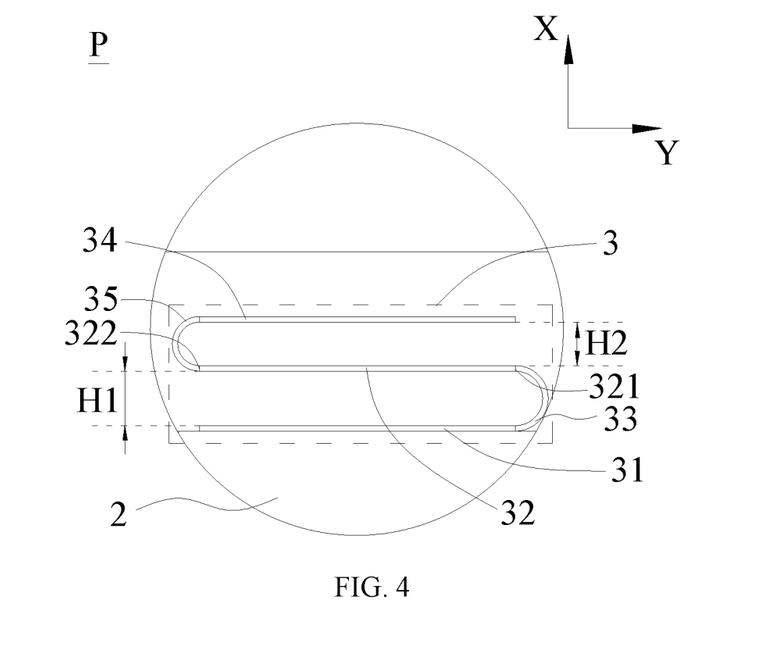
FIG. 4 is a partially enlarged schematic diagram of area P in FIG. 3.

The heat dissipation structure 3 includes the first heat dissipation member 31 and the second heat dissipation member 32. Along the first direction X, the first heat dissipation member 31 and the second heat dissipation member 32 at least partially overlap, which refers to that in a plane perpendicular to the first direction X, there is an overlapping area between an orthographic projection of the first heat dissipation member 31 and an orthographic projection of the second heat dissipation member 32. The first heat dissipation member 31 and the second heat dissipation member 32 are spaced apart in the first direction X, and there is the first interval H1. As shown in FIG. 4, a plane where the first heat dissipation member 31 is located is parallel to a plane where the second heat dissipation member 32 is located, or as shown in FIG. 2, the plane where the first heat dissipation member 31 is located intersects the plane where the second heat dissipation member 32 is located. The first interval H1 refers to a minimum distance between the first heat dissipation member 31 and the second heat dissipation member 32 in the first direction X. The specific value of the first interval H1 needs to be determined by internal size and layout of the display device, which is not limited herein.

The first heat dissipation member 31 and the second heat dissipation member 32 have various material forms, which may be made of the same or different materials. For example, both the first heat dissipation member 31 and the second heat dissipation member 32 include materials with good thermal conductivity, such as copper, gold, silver, aluminum, etc.

The first connection member 33 is configured to connect the first heat dissipation member 31 and the second heat dissipation member 32. In the plane perpendicular to the first direction X, an orthographic projection of the first connection member 33 is outside the orthographic projections of the first heat dissipation member 31 and the second heat dissipation member 32. The first connection member 33 has a certain size in the first direction X, so that the first heat dissipation member 31 and the second heat dissipation member 32 can be spaced apart in the first direction X because of an existence of the first connection member 33. The first connection member 33 may or may not be made of the same material as that of the first heat dissipation member 31 or the second heat dissipation member 32. Also, the first connection member 33 may have a linear structure, a zigzag structure, or another structure.

For example, as shown in FIG. 2, the first heat dissipation member 31 and the second heat dissipation member 32 are arranged at a certain angle, i.e., the first heat dissipation member 31 and the second heat dissipation member 32 are not arranged in parallel. At this time, the first connection member 33 has a zigzag structure, and an included angle formed by the first connection member 33 is an inclination angle of the second heat dissipation member 32 relative to the first heat dissipation member 31. As another example, as shown in FIG. 4, the first heat dissipation member 31 and the second heat dissipation member 32 are arranged in parallel, where the first connection member 33 has an arc structure, and a deflection angle of the arc structure is 180°.

It should be noted that although cross-sectional shapes of the first heat dissipation member 31 and the second heat dissipation member 32 are linear structures in some embodiments, according to actual needs, the cross-sectional shape of the first heat dissipation member 31 or the second heat dissipation member 32 may also be arranged as a curve or another structure, which is not limited herein.

When the display device is working, heat generated by the structure to be dissipated 2 can be transferred to the first heat dissipation member 31, and then transferred to the second heat dissipation member 32 through the first heat dissipation member 31. Since the first heat dissipation member 31 and the second heat dissipation member 32 are arranged with the first interval H1 in the first direction X, a gap space can be formed between the first heat dissipation member 31 and the second heat dissipation member 32 for air to enter because of an existence of the first interval H1. Compared with a solution where the first heat dissipation member 31 and the second heat dissipation member 32 are attached together, in the embodiments of the present disclosure, heat dissipation areas of the first heat dissipation member 31 and the second heat dissipation member 32 where heat can be exchanges with air can be increased, which helps to use air to take away heat in the first heat dissipation member 31 and the second heat dissipation member 32, so as to realize heat dissipation and cooling down of the structure to be dissipated 2.

In summary, in the display device provided by the embodiments of the present disclosure, part of the heat in the structure to be dissipated 2 can be taken away through the first heat dissipation member 31 and the second heat dissipation member 32 in the heat dissipation structure 3. Also, the first heat dissipation member 31 and the second heat dissipation member 32 are spaced apart in the first direction X, so that a heat exchange area between the two and the air can be increased. Therefore, the heat can be dissipated into the air faster, which improves heat dissipation effect of the heat dissipation structure 3 to the structure to be dissipated 2.

It should be noted that, in addition to the first heat dissipation member 31 and the second heat dissipation member 32, the heat dissipation structure 3 may also include other heat dissipation members. The present disclosure does not limit number of the heat dissipation members in the heat dissipation structure 3. When the number of the heat dissipation members in the heat dissipation structure 3 is not less than three, any two adjacent heat dissipation members are spaced apart in the first direction X.

In some embodiments, as shown in FIG. 2, the heat dissipation structure 3 also includes a third heat dissipation member 34 arranged at one side of the second heat dissipation member 32 away from the first heat dissipation member 31. In the first direction X, the third heat dissipation member 34 and the second heat dissipation member 32 at least partially overlap, and the third heat dissipation member 34 is connected to the second heat dissipation member 32 through a second connection member 35. Also, there is a second interval H2 between the second heat dissipation member 32 and the third heat dissipation member 34 in the first direction X.

The second heat dissipation member 32 has a first end 321 and a second end 322 that are opposite in a second direction Y. The first connection member 33 is connected to the first end 321, and the second connection member 35 is connected to the second end 322. The first direction X intersects the second direction Y. For example, the first direction X is perpendicular to the second direction Y.

The first heat dissipation member 31, the second heat dissipation member 32, and the third heat dissipation member 34 are stacked sequentially in the first direction X. Material of the third heat dissipation member 34 may or may not be the same as that of the first heat dissipation member 31 or the second heat dissipation member 32. Also, a plane where the third heat dissipation member 34 is located may be parallel to or intersect the plane where the second heat dissipation member 32 is located.

For example, as shown in FIG. 2, the first heat dissipation member 31 and the third heat dissipation member 34 are arranged in parallel, and the second heat dissipation member 32 is arranged at certain angles with the first heat dissipation member 31 and the third heat dissipation member 34 respectively, i.e., any one of the first heat dissipation member 31 and the third heat dissipation member 34 is arranged to intersect the second heat dissipation member 32. As another example, as shown in FIG. 4, the first heat dissipation member 31, the second heat dissipation member 32, and the third heat dissipation member 34 are arranged parallel to each other.

There is the second interval H2 between the second heat dissipation member 32 and the third heat dissipation member 34 in the first direction X. The second interval H2 refers to a minimum distance between the second heat dissipation member 32 and the third heat dissipation member 34 in the first direction X. The second interval H2 may have the same value as the first interval H1, and the second interval H2 may also be larger or smaller than the first interval H1.

The second heat dissipation member 32 and the third heat dissipation member 34 need the second connection member 35 to realize connection, which is the same as the first connection member 33. In the plane perpendicular to the first direction X, an orthographic projection of the second connection member 35 is outside orthographic projections of the second heat dissipation member 32 and the third heat dissipation member 34. The second connection member 35 may or may not be made of the same material as that of the second heat dissipation member 32 or the third heat dissipation member 34. For example, the first connection member 33 and the second connection member 35 are made of the same material.

In addition, the second connection member 35 may have various structural forms, such as a linear structure, a zigzag structure, or another structure. A structural form of the first connection member 33 may or may not be the same as that of the second connection member 35. For example, as shown in FIG. 2, the first connection member 33 and the third connection member 35 both have zigzag structures. The included angle of the first connection member 33 determines the inclination angle of the second heat dissipation member 32 relative to the first heat dissipation member 31, and an included angle of the second connection member 35 determines an inclination angle of the second heat dissipation member 32 relative to the third heat dissipation member 34. In some embodiments, the included angle of the first connection member 33 is the same as the included angle of the second connection member 35, and in such design the inclination angle of the second heat dissipation member 32 relative to the first heat dissipation member 31 and that of the second heat dissipation member 32 relative to the third heat dissipation member 34 are the same, so that the first heat dissipation member 31 and the third heat dissipation member 34 can be arranged in parallel.

The second heat dissipation member 32 has a certain extension size in the second direction Y, and the second heat dissipation member 32 may extend along the second direction Y or extend obliquely relative to the second direction Y. For example, as shown in FIG. 4, the second heat dissipation member 32 extends along the second direction Y, and the second direction Y may be a length direction or a width direction of the second heat dissipation member 32. The second heat dissipation member 32 has the first end 321 and the second end 322 that are opposite in the second direction Y. The first connection member 33 is connected to the first end 321 of the second heat dissipation member 32, and the second connection member 35 is connected to the second end 322 of the second heat dissipation member 32, i.e., the first connection member 33 and the second connection member 35 are spaced apart in the second direction Y.

In such design, structural reliability of the heat dissipation structure 3 can be improved. For example, if the first connection member 33 and the second connection member 35 are both arranged at the first end 321, when the heat dissipation structure 3 is affected by factors such as external forces, the first end 321 of the second heat dissipation member 32 is affected by double stress of the first connection member 33 and the second connection member 35 at the same time, which easily causes the second heat dissipation member 32 to tilt and rotate relative to the first end 321. However, in the embodiments of the present disclosure, the first connection member 33 and the second connection member 35 are arranged at the first end 321 and the second end 322 respectively. When the heat dissipation structure 3 is affected by factors such as external forces, both the first end 321 and the second end 322 of the second heat dissipation member 32 are affected by the stress, so that it is ensured that relative position of the second heat dissipation member 32 remains stable, which improves reliability.

In some embodiments, size of the first interval H1 in the first direction X is larger than size of the second interval H2 in the first direction X.

It can be seen from the foregoing that the first heat dissipation member 31 is located at one side of the second heat dissipation member 32 close to the structure to be dissipated 2. Generally, the closer to the structure to be dissipated 2, the higher the temperature. Therefore, temperature of the first heat dissipation member 31 is higher than that of the second heat dissipation member 32 and that of the third heat dissipation member 34.

On such basis, in the embodiments of the present disclosure, the size of the first interval H1 in the first direction X is set to be larger than the size of the second interval H2 in the first direction X, so that size of the gap space formed between the first heat dissipation member 31 and the second heat dissipation member 32 in the first direction X is larger than size of a gap space formed between the third heat dissipation member 34 and the second heat dissipation member 32 in the first direction X. Therefore, more air can be accommodated between the first heat dissipation member 31 and the second heat dissipation member 32 to dissipate the heat in the first heat dissipation member 31 faster, which improves the heat dissipation effect of the heat dissipation structure 3.

In some embodiments, as shown in FIG. 4, the first connection member 33 includes an arc segment, and the arc segment is connected to same side of the first heat dissipation member 31 and the second heat dissipation member 32 in the second direction Y. In the second direction Y, the arc segment is formed by protruding in a direction away from the first heat dissipation member 31 and the second heat dissipation member 32.

The first connection member 33 is configured to connect the first heat dissipation member 31 and the second heat dissipation member 32, and meanwhile, the first connection member 33 has a certain size in the first direction X, so that the first heat dissipation member 31 and the second heat dissipation member 32 are spaced apart in the first direction X. On such basis, the first connection member 33 includes the arc segment protruding in the direction away from the first heat dissipation member 31 and the second heat dissipation member 32.

Since the arc structure generally has a certain elastic potential energy, the first connection member 33 has a certain compression and rebound deformation performance under an elastic action of the arc segment, which can play a buffering effect. For example, when one of the first heat dissipation member 31 and the second heat dissipation member 32 moves toward the other due to factors such as external forces, the first connection member 33 can rebound under pressure to buffer and prevent the first heat dissipation member 31 and the second heat dissipation member 32 from approaching each other, which improves impact resistance of the heat dissipation structure 3.

It should be noted that the material of the first connection member 33 is not limited herein. For example, the first connection member 33 may be made of a material with good ductility and thermal conductivity, such as copper foil.

In some embodiments, the first heat dissipation member 31, the first connection member 33, the second heat dissipation member 32, the second connection member 35, and the third heat dissipation member 34 are connected to each other to form an integrated structure.

The first heat dissipation member 31, the first connection member 33, the second heat dissipation member 32, the second connection member 35, and the third heat dissipation member 34 are connected to each other to form an integrated structure, which refers to that multiple structures are all made of the same material and formed in the same process. In such design, the first connection member 33 and the second connection member 35 can also have certain heat dissipation capabilities, which improves the heat dissipation effect of the heat dissipation structure 3.

In addition, when the heat dissipation structure 3 is fabricated, a complete planar structure may be first formed by using materials with good thermal conductivity, and then the planar structure is bent to form the first heat dissipation member 31, the first connection member 33, the second heat dissipation member 32, the second connection member 35, and the third heat dissipation member 34. In this way, processing steps and processing difficulty of the heat dissipation structure 3 can be reduced, which is beneficial to mass production.

Figure 3:
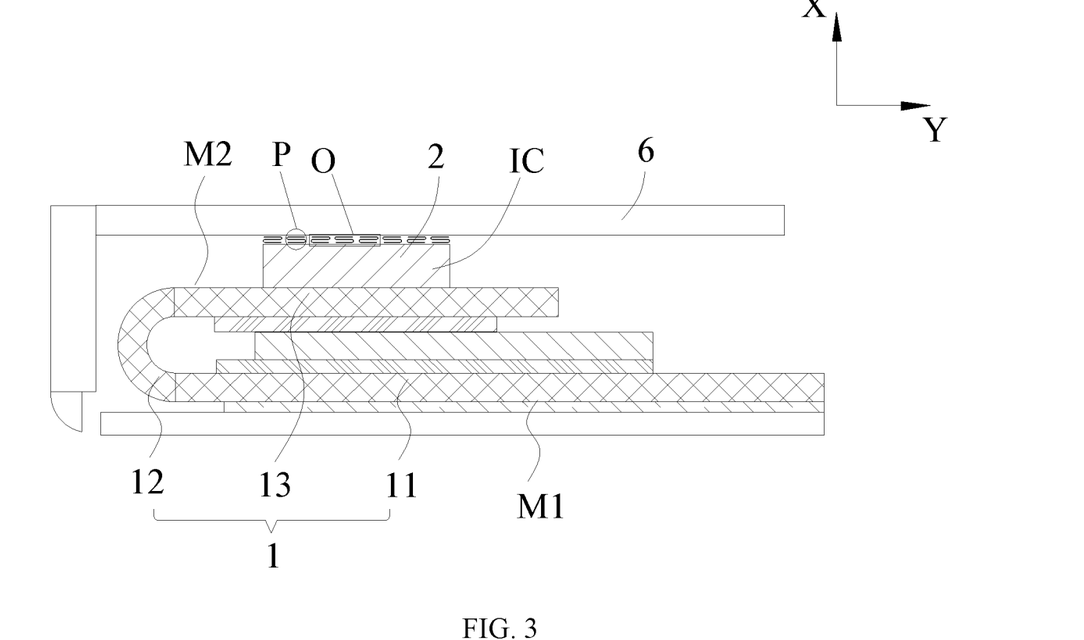
FIG. 3 is a schematic diagram of an internal structure of another display device according to an embodiment of the present disclosure.
Figure 5:
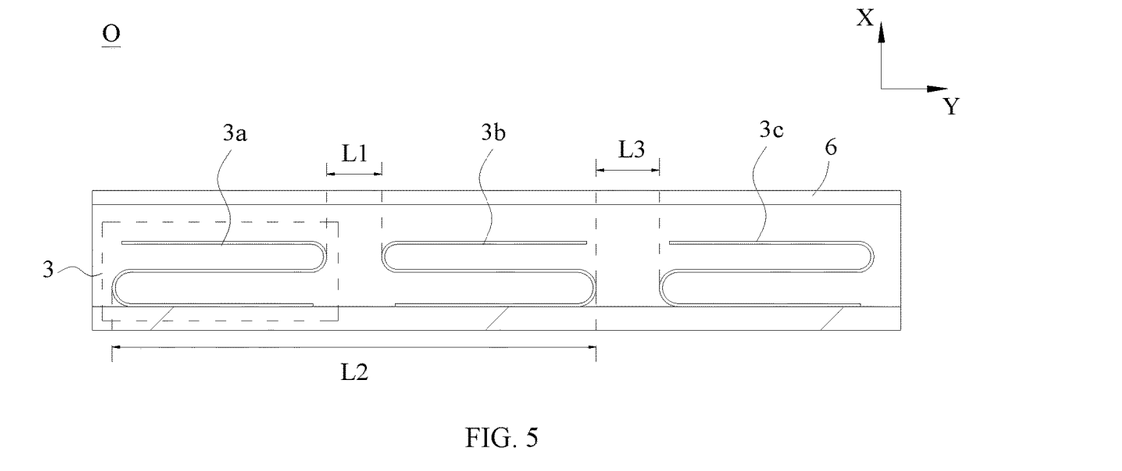
FIG. 5 is a partially enlarged schematic diagram of area O in FIG. 3.

In some embodiments, referring to FIGS. 3 and 5, there are a plurality of heat dissipation structures 3, and the plurality of the heat dissipation structures 3 include a first heat dissipation structure 3a and a second heat dissipation structure 3b that are spaced apart in the second direction Y.

Size of the first heat dissipation structure 3a in the second direction Y is the same as size of the second heat dissipation structure 3b in the second direction Y.

Number of the heat dissipation structures 3 includes but not limited to two, three, four, etc., and each heat dissipation structure 3 may have a heat dissipation effect on the structure to be dissipated 2. Any two adjacent heat dissipation structures 3 are spaced apart from each other, and arrangement directions of different adjacent two heat dissipation structures 3 may be the same or different. That is, the first heat dissipation structure 3a and the second heat dissipation structure 3b are spaced apart in the second direction Y, while another two adjacent heat dissipation structures 3 may be spaced apart in the second direction Y, or may be spaced apart in another direction intersecting the second direction Y.

On such basis, in some embodiments, the size of the first heat dissipation structure 3a in the second direction Y is the same as the size of the second heat dissipation structure 3b in the second direction Y, so that heat dissipation areas of the first heat dissipation structure 3a and the second heat dissipation structure 3b relative to the structure to be dissipated 2 are consistent. Therefore, the heat dissipation effects in different regions of the structure to be dissipated 2 can be the same, and risk of excessive temperature differences in different regions of the structure to be dissipated 2 can be reduced.

Further, in some embodiments, structure of the first heat dissipation structure 3a is consistent with structure of the second heat dissipation structure 3b, i.e., numbers of heat dissipation members and structural layouts of the two are the same.

In some embodiments, a minimum distance between the first heat dissipation structure 3a and the second heat dissipation structure 3b is L1, and a maximum distance between the first heat dissipation structure 3a and the second heat dissipation structure 3b is L2, where L1 and L2 satisfy $1/4 \leq L1/L2 \leq 1/2$.

Referring to FIGS. 4 and 5, the minimum distance L1 between the first heat dissipation structure 3a and the second heat dissipation structure 3b refers to a distance between the first connection member 33 in the first heat dissipation structure 3a and the first connection member 33 in the second heat dissipation structure 3b in the second direction Y, i.e., a separation distance between the first heat dissipation structure 3a and the second heat dissipation structure 3b. The maximum distance L2 between the first heat dissipation structure 3a and the second heat dissipation structure 3b refers to a distance between the second connection member 35 in the first heat dissipation structure 3a and the second connection member 35 in the second heat dissipation structure 3b in the second direction Y, i.e., a sum of the separation distance between the first heat dissipation structure 3a and the second heat dissipation structure 3b, the size of the first heat dissipation structure 3a in the second direction Y, and the size of the second heat dissipation structure 3b in the second direction Y.

If L1/L2 is too large, it indicates that a gap between the first heat dissipation structure 3a and the second heat dissipation structure 3b is too large, i.e., an area where the heat dissipation effect cannot be realized on the structure to be dissipated 2 is too large, which will easily lead to high temperature risk when the display device is working, due to that there is a large area on the structure to be dissipated 2 that cannot meet heat dissipation requirements. If L1/L2 is too small, it indicates that distance between the first heat dissipation structure 3a and the second heat dissipation structure 3b is too short, so that when the first dissipation structure 3a and the second heat dissipation structure 3b are working, it is easy to cause a risk of thermal interference between the first heat dissipation structure 3a and the second heat dissipation structure 3b, which is not conducive to respective heat dissipation effects of the first heat dissipation structure 3a and the second heat dissipation structure 3b.

Therefore, in some embodiments, L1/L2 is set between 1/4 and 1/2. While the heat dissipation requirements of a large area of the structure to be dissipated 2 are met, a probability of the thermal interference between the first heat dissipation structure 3a and the second heat dissipation structure 3b is reduced, which improves the heat dissipation effect. For example, L1/L2 is one of 0.25, 0.35, 0.40, 0.45, and 0.5.

In some embodiments, as shown in FIGS. 3 and 5, the display device also includes a third heat dissipation structure 3c located at one side of the second heat dissipation structure 3b away from the first heat dissipation structure 3a along the second direction Y. The minimum distance L1 between the first heat dissipation structure 3a and the second heat dissipation structure 3b in the second direction Y is equal to a minimum distance L3 between the third heat dissipation structure 3c and the second heat dissipation structure 3b in the second direction Y.

It can be seen from the foregoing that the minimum distance L1 between the first heat dissipation structure 3a and the second heat dissipation structure 3b in the second direction Y is the separation distance between the first heat dissipation structure 3a and the second heat dissipation structure 3b. Similarly, the minimum distance L3 between the second heat dissipation structure 3b and the third heat dissipation structure 3c in the second direction Y is a separation distance between the second heat dissipation structure 3b and the third heat dissipation structure 3c.

In some embodiments, separation distance between two adjacent heat dissipation structures 3 is the same. In such design, all parts of the structure to be dissipated 2 can be uniformly dissipated, which reduces temperature difference in different regions of the structure to be dissipated 2, and improves usage reliability of the display device.

In some embodiments, referring to FIGS. 6-9, there are a plurality of heat dissipation structures 3, and the plurality of the heat dissipation structures 3 include the first heat dissipation structure 3a and the second heat dissipation structure 3b arranged side by side in the second direction Y. The first heat dissipation structure 3a and the second heat dissipation structure 3b are integrally connected, i.e., at least part of the first heat dissipation structure 3a and at least part of the second heat dissipation structure 3b can be made of the same material and formed in the same preparation process. In this way, preparation processes of the multiple heat dissipation structures 3 can be simplified and production effect can be improved.

Figure 6:
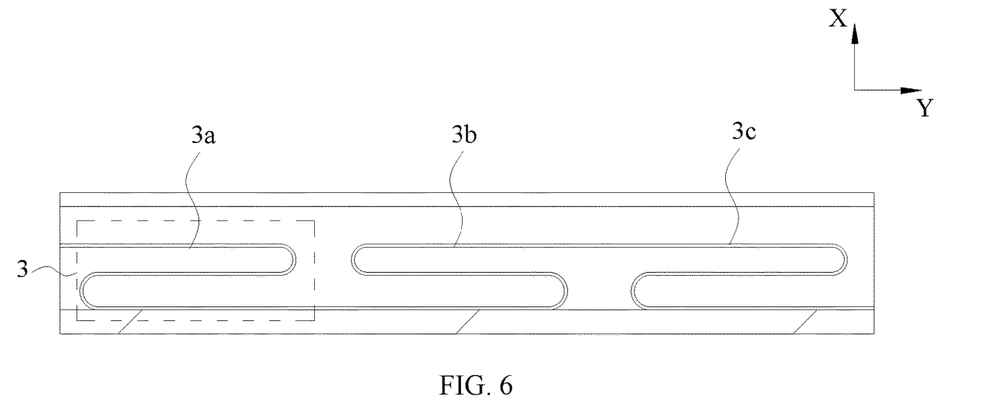
FIG. 6 is an enlarged view of a partial structure of another display device according to an embodiment of the present disclosure.
Figure 7:
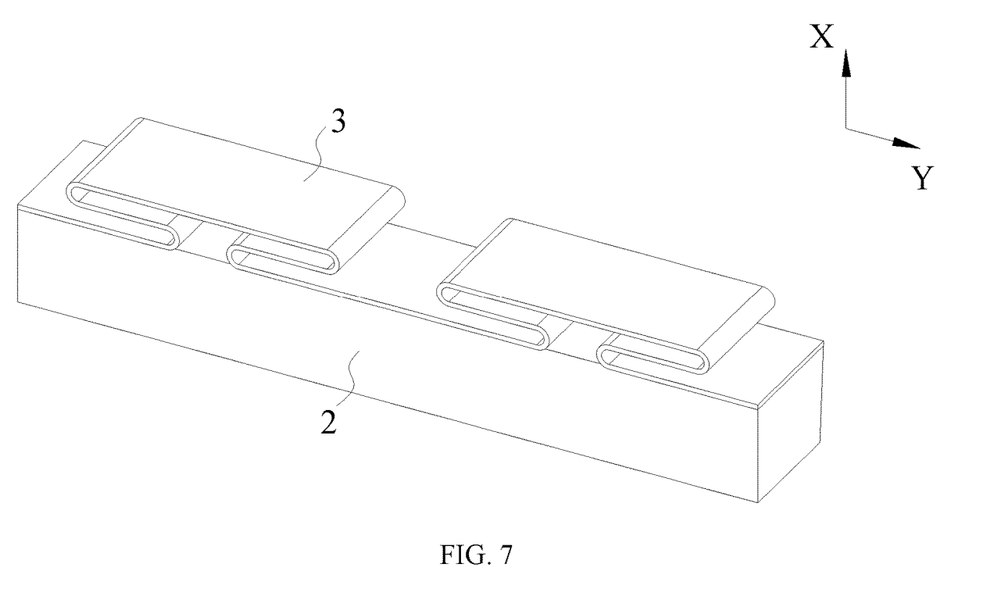
FIG. 7 is a schematic diagram of a cooperative structure of part of a heat dissipation structure and part of a structure to be dissipated in another display device according to an embodiment of the present disclosure.
Figure 8:
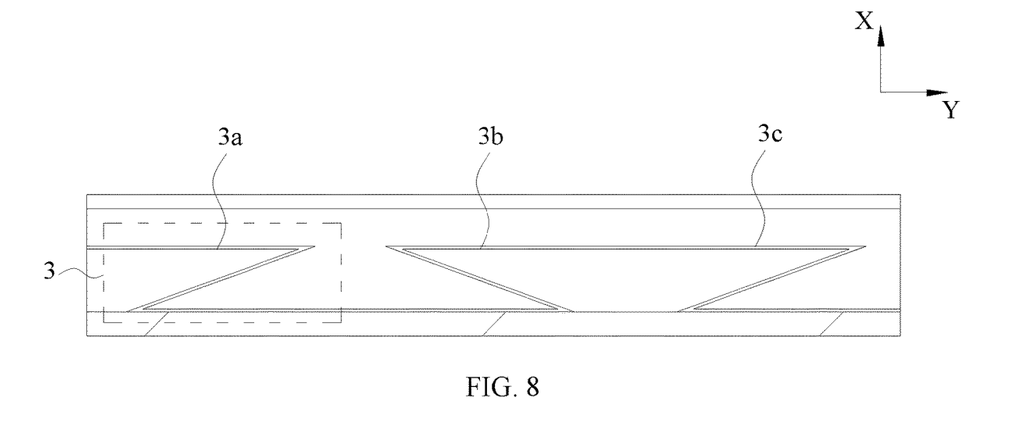
FIG. 8 is an enlarged view of a partial structure of another display device according to an embodiment of the present disclosure.
Figure 9:
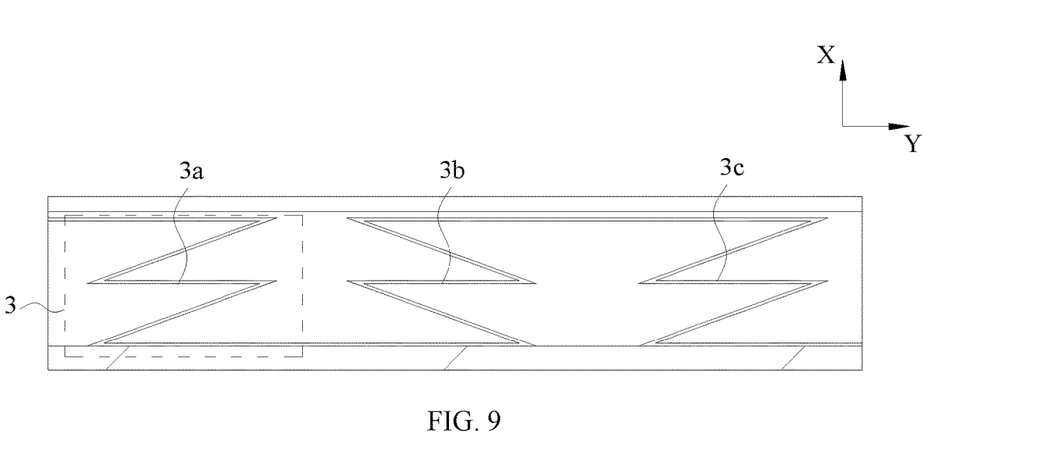
FIG. 9 is an enlarged view of a partial structure of another display device according to an embodiment of the present disclosure.

Some implementation manners in the embodiments of the present disclosure are schematically illustrated in FIGS. 6-9. FIG. 7 is an axonometric view of part of the structures in FIG. 6, which is used to clearly show a relationship between the heat dissipation structure 3 and the structure to be dissipated 2 in FIG. 6. A difference between FIG. 6 and FIG. 8 is that all the heat dissipation members in FIG. 6 are arranged in parallel, while some heat dissipation members are arranged obliquely relative to other heat dissipation members in FIG. 8. A difference between FIG. 8 and FIG. 9 is that number of the heat dissipation members in a single heat dissipation structure 3 in FIG. 9 is greater than number of the heat dissipation members in a single heat dissipation structure 3 in FIG. 8. It should be noted that the several drawings described above only illustrate some implementation manners in the embodiments of the present disclosure, and there are other similar implementation manners in the embodiments of the present disclosure, which will not be repeated herein.

In some embodiments, orthographic projections of the plurality of the heat dissipation structures 3 on the display panel 1 cover an orthographic projection of the structure to be dissipated 2 on the display panel 1. That is, projections of the plurality of the heat dissipation structures 3 on the first direction X cover a projection of the structure to be dissipated 2 on the first direction X.

Size of the orthographic projection of the plurality of the heat dissipation structures 3 on the display panel 1 may be the same as or larger than size of the orthographic projection of the structure to be dissipated 2 on the display panel 1. When the size of the orthographic projection of the plurality of the heat dissipation structures 3 on the display panel 1 is larger than the size of the orthographic projection of the structure to be dissipated 2 on the display panel 1, at least some heat dissipation structures 3 are arranged beyond the structure to be dissipated 2 in the second direction Y.

In some embodiments, since an overall structure composed of multiple heat dissipation structures 3 can completely cover the structure to be dissipated 2, the multiple heat dissipation structures 3 can dissipate heat at various positions in the structure to be dissipated 2, which can improve the heat dissipation effect and further reduce a probability of excessive temperature of the structure to be dissipated 2.

Figure 10:
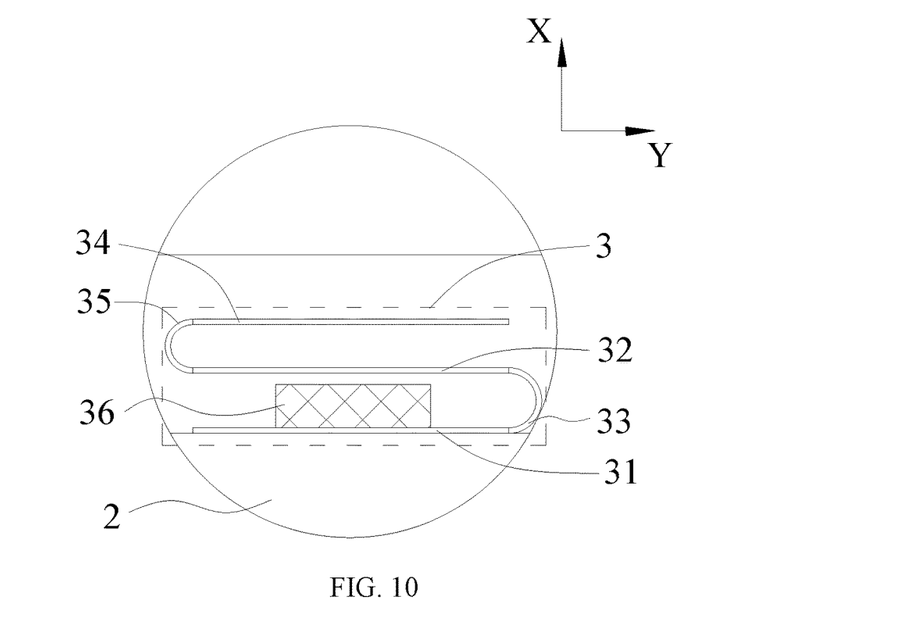
FIG. 10 is an enlarged view of a partial structure of another display device according to an embodiment of the present disclosure.

In some embodiments, referring to FIG. 10, the heat dissipation structure 3 also includes a heat conduction material 36 sandwiched between the first heat dissipation member 31 and the second heat dissipation member 32 and abutting against the first heat dissipation member 31.

It can be seen from the foregoing that the first heat dissipation member 31 and the second heat dissipation member 32 are arranged with the first interval in the first direction X. On such basis, the heat conduction material 36 is arranged between the first heat dissipation member 31 and the second heat dissipation member 32, and the heat conduction material 36 refers to a material with good thermal conductivity. The heat conduction material 36 is abutting against the first heat dissipation member 31, and the heat in the first heat dissipation member 31 can be transferred to outside of the heat dissipation structure 3 through the heat conduction material 36. It should be noted that the heat conduction material 36 may or may not be abutting against the second heat dissipation member 32, which is not limited herein.

Figure 11:
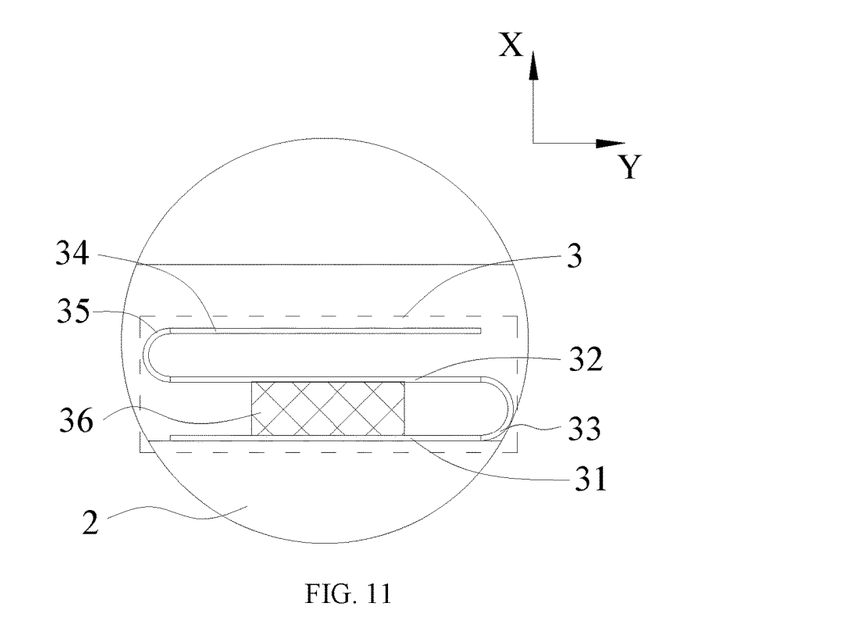
FIG. 11 is an enlarged view of a partial structure of another display device according to an embodiment of the present disclosure.

The specific material and phase state of the heat conducting material 36 are not limited herein. For example, the heat conduction material 36 may include a liquid heat conduction material, such as a heat conduction container and cooling water in the heat conduction container. The cooling water can flow in the heat conduction container, so as to quickly transfer part of the heat in the first heat dissipation member 31 to the outside of the heat dissipation structure 3. As another example, the heat conduction material 36 may also be a solid material, and as shown in FIG. 11, the heat conduction material 36 is abutting against the first heat dissipation member 31 and the second heat dissipation member 32 respectively. In this case, the heat conduction material 36 can not only play a heat conduction effect, but also support the first heat dissipation member 31 and the second heat dissipation member 32, which improves stability of the heat dissipation structure 3.

In some embodiments, the heat conduction material 36 is used to dissipate heat and cool down the first heat dissipation member 31 and the second heat dissipation member 32, which can further improve heat exchange effect compared with the way of using air for heat exchange, and is conducive to rapid cooling of the first heat dissipation member 31 and the second heat dissipation member 32, so that the heat in the structure to be dissipated can be dissipated quickly.

In some embodiments, as shown in FIG. 2, extension directions of the first heat dissipation member 31 and the second heat dissipation member 32 intersect, and an angle formed therebetween is an acute angle.

The second heat dissipation member 32 is arranged obliquely relative to the first heat dissipation member 31, and the angle formed therebetween includes but is not limited to 30°, 45°, and 60°. Referring to FIG. 2, the first heat dissipation member 31, the second heat dissipation member 32, and the third heat dissipation member 34 can form a structure similar to a zigzag. The second heat dissipation member 32 has a certain extension length in the first direction X, so that distance between the first heat dissipation member 31 and the third heat dissipation member 34 in the first direction X can be increased. Therefore, more air can enter between the first heat dissipation member 31 and the third heat dissipation member 34, which achieves better heat exchange effect.

It should be noted that the angle formed between the first heat dissipation member 31 and the second heat dissipation member 32 depends on structure of the first connection member 33. In a structure shown in FIG. 2, the first connection member 33 has a zigzag structure, and an angle formed by the first connection member 33 itself is the angle between the first heat dissipation member 31 and the second heat dissipation member 32.

In some embodiments, as shown in FIG. 1, the display panel 1 includes a display member 11, a bending member 12, and a binding member 13 that are connected in sequence, and the binding member 13 is bent to one side of the backlight surface M2 of the display panel 1 through the bending member 12. The structure to be dissipated 2 includes the driver chip IC, which is arranged at one side of the binding member 13 away from the display member 11 and is electrically connected to the binding member 13.

The display member 11 is a component configured to realize the display effect in the display panel 1. Generally, one side of the display member 11 away from the binding member 13 is a light emission surface M1 of the display member 11, which is configured to display specific pictures or videos to users.

The binding member 13 is arranged opposite to the display member 11 in the first direction X, and a connection therebetween is realized through the bending member 12. The driver chip IC is arranged at the binding member 13, and the driver chip IC includes various types, such as a display driver chip IC and a touch driver chip IC. The display driver chip IC is configured to store image data and generate driving voltage, and can also improve image quality through custom algorithms. The touch driver chip IC mainly implements touch signal processing, and is a necessary component of the display device with a touch function. In some other embodiments, the display driver chip IC and the touch driver chip IC can also be integrated and arranged at the binding member 13.

When the display device is working, especially in a case of high resolution, the driver chip IC will generate a lot of heat, and meanwhile temperature of the driver chip IC will rise sharply. At this time, the heat dissipation structure can dissipate at least part of heat in the driver chip IC in time, so that the temperature of the driver chip IC can be effectively reduced, and probability of abnormal display due to excessive temperature of the driver chip IC can be reduced.

It should be noted that, in addition to the display member 11, the bending member 12, and the binding member 13, the display panel 1 may also include a buffer layer 14 and support layers 15. The buffer layer 14 is configured to realize buffering effect of the display device. Number of the support layers 15 is two, and the two support layers 15 are respectively located at two sides of the buffer layer 14 to support the binding member 13 and the display member 11.

Figure 12:
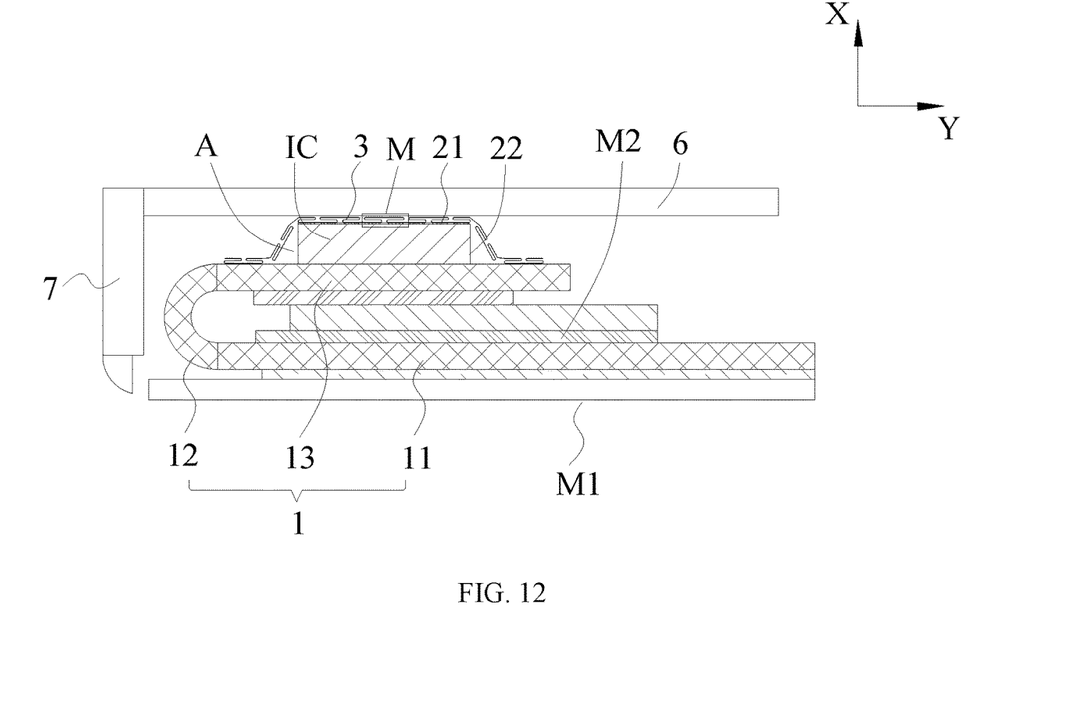
FIG. 12 is a schematic diagram of an internal structure of another display device according to an embodiment of the present disclosure.

In some embodiments, referring to FIG. 12, the driver chip IC includes a first surface 21 at one side away from the binding member 13, and a side surface 22 surrounding and intersecting the first surface 21. There are multiple heat dissipation structures 3, where at least some dissipation structures 3 are arranged at one side of the first surface 21 away from the binding member 13, and at least some heat dissipation structures 3 are arranged at one side of the side surface 22 away from the driver chip IC.

The first surface 21 may be perpendicular to the first direction, and the side surface 22 is connected to and intersect the first surface 21. Sizes and shapes of the first surface 21 and the side surface 22 depend on size and shape of the driver chip IC. For example, when the driver chip IC has a square structure, the first surface 21 is rectangular, and number of the side surfaces 22 is multiple, all of which are planar.

The multiple heat dissipation structures 3 are respectively distributed at the first surface 21 and the side surface 22. When the number of the side surfaces 22 is multiple, the multiple heat dissipation structures 3 may be arranged at all the side surfaces 22, or only at some side surfaces 22.

Heat generated by the driver chip IC is generally transferred to outside of the driver chip IC through the first surface 21 and the side surface 22. On such basis, in some embodiments, both the first surface 21 and the side surface 22 are provided with the heat dissipation structures 3, which dissipate heat in the side surface 22 and the first surface 21, so that the heat dissipation effect on the driver chip IC can be improved.

Figure 13:
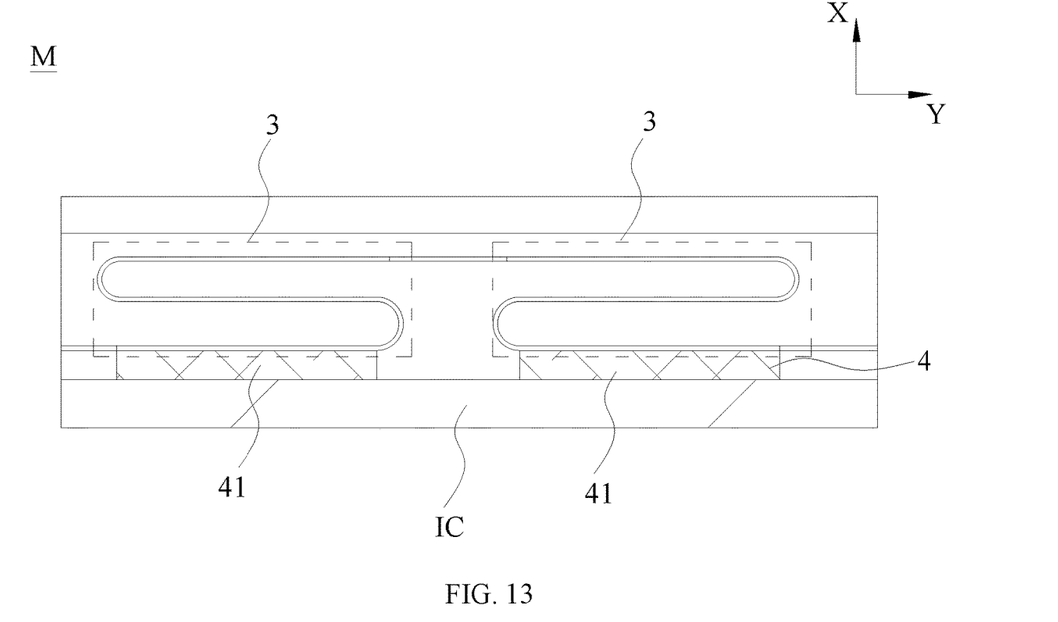
FIG. 13 is a partially enlarged schematic diagram of area M in FIG. 12.

In some embodiments, referring to FIG. 13, the display device also includes a first bonding member 4 arranged at one side of the heat dissipation structure 3 close to the driver chip IC. The heat dissipation structure 3 is fixed to the driver chip IC through the first bonding member 4.

The first bonding member 4 is configured to bond and fix the heat dissipation structure 3 and the driver chip IC. For example, the first bonding member 4 is a heat conduction adhesive, which can realize heat transfer between the heat dissipation structure 3 and the driver chip IC while meeting bonding requirements.

An existence of the first bonding member 4 can ensure fixed relative positions of the heat dissipation structure 3 and the driver chip IC, so that a risk of relative displacement between the heat dissipation structure 3 and the driver chip IC can be reduced during use or movement of the display device, and positional reliability therebetween can be improved. Meanwhile, the first bonding member 4 makes a distance between the heat dissipation structure 3 and the driver chip IC smaller, which helps to transfer the heat in the driver chip IC to the heat dissipation structure 3, which meets the heat dissipation requirements.

Figure 14:
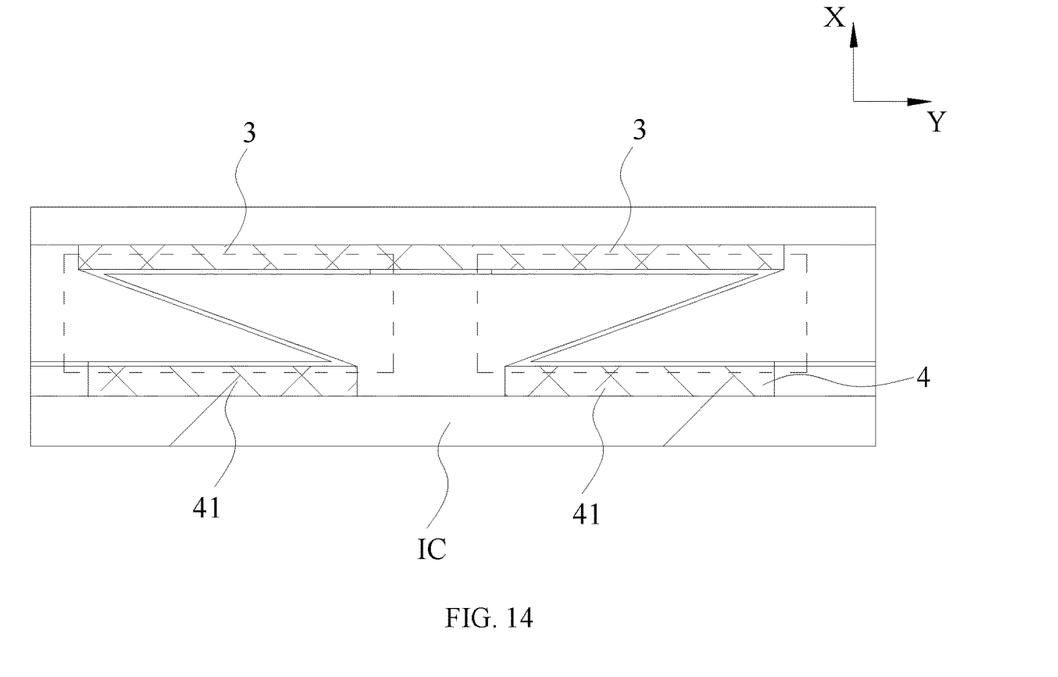
FIG. 14 is an enlarged view of a partial structure of another display device according to an embodiment of the present disclosure.

In some embodiments, referring to FIGS. 13 and 14, the first bonding member 4 includes a plurality of bonding sub-members 41 connected to the heat dissipation structure 3, and the plurality of the bonding sub-members 41 are spaced apart in the second direction Y.

The plurality of the bonding sub-members 41 are configured to realize bonding and fixing between the heat dissipation structure 3 and the driver chip IC. The plurality of the bonding sub-members 41 can be correspondingly arranged at a single heat dissipation structure 3, or can be correspondingly arranged at the plurality of the heat dissipation structures 3. For example, number of the bonding sub-members 41 is the same as the number of the heat dissipation structures 3, and each bonding sub-member 41 is arranged corresponding to a single heat dissipation structure 3.

Figure 15:
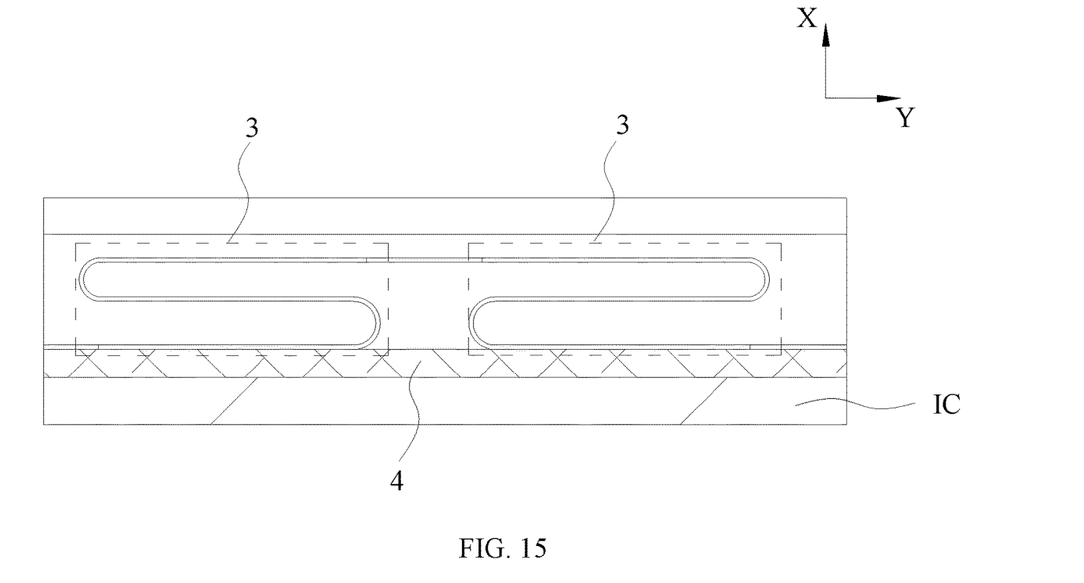
FIG. 15 is an enlarged view of a partial structure of another display device according to an embodiment of the present disclosure.

In some embodiments, referring to FIG. 15, the first bonding member 4 is an integrated structure and is connected to the heat dissipation structure 3.

When there are multiple heat dissipation structures 3, the integrated structure of the first bonding member 4 can bond and fix multiple heat dissipation structures 3 and the driver chip IC at the same time. For example, in the plane perpendicular to the first direction X, an outer contour of the first bonding member 4 coincides with outer contours of the multiple heat dissipation structures 3.

In such design, all areas of the heat dissipation structure 3 can be bonded and fixed to the structure to be dissipated 2 through the first bonding member 4, which improves bonding reliability and reduces probability of the relative displacement between the driver chip IC and the heat dissipation structure 3.

In some embodiments, as shown in FIG. 12, there are multiple heat dissipation structures 3. The multiple heat dissipation structures 3 are an integrated structure, which is sandwiched together with the binding member 13 to form an accommodation space A for accommodating the driver chip IC.

Part of the heat dissipation structure 3 is connected and fixed to the binding member 13, and a connection method includes but is not limited to bonding, welding, bolt connection, etc. For example, the display device also includes a third bonding member, and part of the heat dissipation structure 3 is bonded and fixed to the binding member 13 through the third bonding member.

In addition, at least part of the heat dissipation structure 3 is spaced apart from the binding member 13 in the first direction X, so as to form the accommodation space A. The driver chip IC is located inside the accommodation space A, and position of the driver chip IC can be jointly limited by the heat dissipation structure 3 and the binding member 13, which reduces the risk of relative displacement of the driver chip IC. Meanwhile, in such design, the relative positions of the heat dissipation structure 3 and the driver chip IC are closer, which is beneficial to improve the heat dissipation effect of the heat dissipation structure 3 on the driver chip IC.

Figure 16:
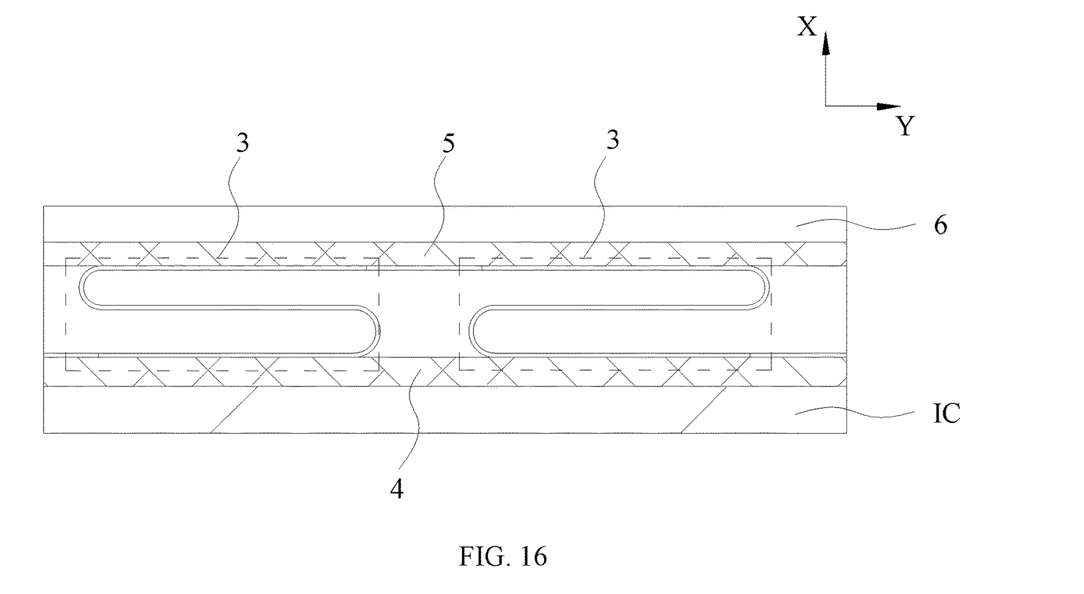
FIG. 16 is an enlarged view of a partial structure of another display device according to an embodiment of the present disclosure.

In some embodiments, referring to FIG. 16, the display device also includes a support layer 6 arranged at one side of the driver chip IC away from the display member 11, and a second bonding member 5 for fixing the support layer 6 and the heat dissipation structure 3.

The support layer 6 is configured to support the display panel 1 and the driver chip IC, and at least part of the heat dissipation structure 3 is sandwiched between the driver chip IC and the support layer 6. On such basis, in some embodiments, the heat dissipation structure 3 and the support layer 6 are bonded and fixed through the second bonding member 5, which reduces probability of relative displacement of the heat dissipation structure 3 and improves positional reliability of the heat dissipation structure 3. Structure of the second bonding member 5 is not limited herein, and the second bonding member 5 may be an integrated structure, or may be formed by a plurality of sub-members that are spaced apart.

It should be noted that, in some other embodiments, there may be no bonding member provided between the support layer 6 and the heat dissipation structure 3. For example, the support layer 6 and the heat dissipation structure 3 may be in direct contact without a gap between them, and at this time no additional bonding member is needed to fix the support layer 6 and the heat dissipation structure 3.

In addition, as shown in FIG. 12, the display device also includes a middle frame 7, which is arranged around a periphery of the display device and can be fixedly connected to the support layer 6. Both the middle frame 7 and the support layer 6 can protect internal structures of the display device, which improves impact resistance of the display device.

In some embodiments, material of the first heat dissipation member includes at least one of copper and graphite.

Both copper and graphite are materials with good heat dissipation effect, which helps to quickly dissipate the heat in the structure to be dissipated, so as to meet cooling requirements of the structure to be dissipated. For example, the first heat dissipation member is a copper foil or a graphite sheet. In such design, the first heat dissipation member can have a certain degree of ductility, which is beneficial for bending to form different structures.

In a display device provided by the embodiments of the present disclosure, part of the heat in the structure to be dissipated can be taken away through the first heat dissipation member and the second heat dissipation member in the heat dissipation structure. Also, the first heat dissipation member and the second heat dissipation member are spaced apart in the first direction, so that the heat exchange area between the two and the air can be increased. Therefore, the heat can be dissipated into the air faster, which improves the heat dissipation effect of the heat dissipation structure to the structure to be dissipated.

Although the embodiments disclosed in the present disclosure are as above, the content described is only the embodiments adopted for the convenience of understanding the present disclosure, and is not intended to limit the present disclosure. Those skilled in the art can make any modifications and changes in the form and details of implementation without departing from the spirit and scope disclosed in the present disclosure, but the protection scope of the present disclosure shall remain to be defined by the appended claims.

The above are only some specific embodiments of the present disclosure. Those skilled in the art can clearly understand that, for the replacement of other connection modes described above, reference may be made to the corresponding processes in the foregoing method embodiments for the convenience and brevity of the description, which will not be repeated herein. It should be understood that the scope of the present disclosure is not limited hereto. Any person skilled in the art can easily conceive various equivalent modifications or substitutions within the technical scope disclosed in the present disclosure, and these modifications or substitutions should be within the scope of the present disclosure.

What is claimed is:

1. A display device comprising:
a display panel;
a structure to be dissipated located at one side of a backlight surface of the display panel; and
a heat dissipation structure located at one side of the structure to be dissipated away from the display panel, wherein:
the heat dissipation structure includes a first heat dissipation member, a second heat dissipation member and a third heat dissipation member arranged at one side of the second heat dissipation member away from the first heat dissipation member, the first heat dissipation member being connected to the second heat dissipation member through a first connection member and the third heat dissipation member being connected to the second heat dissipation member through a second connection member;
the first heat dissipation member, the second heat dissipation member and the third heat dissipation member at least partially overlap along a first direction perpendicular to a plane where the display panel is located; and
a first interval is between the first heat dissipation member and the second heat dissipation member in the first direction.

2. The display device according to claim 1, wherein:
a second interval is between the second heat dissipation member and the third heat dissipation member in the first direction; and
the second heat dissipation member includes a first end and a second end that are opposite in a second direction intersecting the first direction, the first connection member being connected to the first end, and the second connection member being connected to the second end.

3. The display device according to claim 2, wherein:
the first heat dissipation member is located at one side of the second heat dissipation member close to the structure to be dissipated; and
a size of the first interval in the first direction is larger than a size of the second interval in the first direction.

4. The display device according to claim 2, wherein:
the first connection member includes an arc segment, the arc segment being connected to a same side of the first heat dissipation member and the second heat dissipation member in the second direction; and
the arc segment is formed by protruding in a direction away from the first heat dissipation member and the second heat dissipation member in the second direction.

5. The display device according to claim 2, wherein the first heat dissipation member, the first connection member, the second heat dissipation member, the second connection member, and the third heat dissipation member are connected to each other to form an integrated structure.

6. The display device according to claim 1, wherein:
there are a plurality of heat dissipation structures, the plurality of the heat dissipation structures including a first heat dissipation structure and a second heat dissipation structure that are spaced apart in a second direction intersecting the first direction; and
a size of the first heat dissipation structure in the second direction is the same as a size of the second heat dissipation structure in the second direction.

7. The display device according to claim 6, wherein a minimum distance between the first heat dissipation structure and the second heat dissipation structure is L1, and a maximum distance between the first heat dissipation structure and the second heat dissipation structure is L2, L1 and L2 satisfying $1/4 \leq L1/L2 \leq 1/2$.

8. The display device according to claim 6, further comprising a third heat dissipation structure located at one side of the second heat dissipation structure away from the first heat dissipation structure along the second direction, a minimum distance between the first heat dissipation structure and the second heat dissipation structure in the second direction being equal to a minimum distance between the third heat dissipation structure and the second heat dissipation structure in the second direction.

9. The display device according to claim 1, wherein:
there are a plurality of heat dissipation structures, the plurality of the heat dissipation structures including a first heat dissipation structure and a second heat dissipation structure arranged side by side in a second direction intersecting the first direction; and
the first heat dissipation structure and the second heat dissipation structure are integrally connected.

10. The display device according to claim 9, wherein orthographic projections of the plurality of the heat dissipation structures on the display panel cover an orthographic projection of the structure to be dissipated on the display panel.

11. The display device according to claim 1, wherein the heat dissipation structure further includes a heat conduction material sandwiched between the first heat dissipation member and the second heat dissipation member and abutting against the first heat dissipation member.

12. The display device according to claim 1, wherein extension directions of the first heat dissipation member and the second heat dissipation member intersect, and an angle formed therebetween is an acute angle.

13. The display device according to claim 1, wherein:
the display panel includes a display member, a bending member, and a binding member that are connected in sequence, the binding member being bent to one side of the backlight surface of the display panel through the bending member; and
the structure to be dissipated includes a driver chip, the driver chip being arranged at one side of the binding member away from the display member and being electrically connected to the binding member.

14. The display device according to claim 13, wherein:
the driver chip includes a first surface at one side away from the binding member, and a side surface surrounding and intersecting the first surface; and
there are a plurality of heat dissipation structures, at least some dissipation structures being arranged at one side of the first surface away from the binding member, and at least some heat dissipation structures being arranged at one side of the side surface away from the driver chip.

15. The display device according to claim 13, further comprising a first bonding member arranged at one side of the heat dissipation structure close to the driver chip, the heat dissipation structure being fixed to the driver chip through the first bonding member.

16. The display device according to claim 15, wherein the first bonding member includes a plurality of bonding sub-members connected to the heat dissipation structure, the plurality of the bonding sub-members being spaced apart in the second direction intersecting the first direction.

17. The display device according to claim 15, wherein the first bonding member is an integrated structure and is connected to the heat dissipation structure.

18. The display device according to claim 13, wherein there are a plurality of heat dissipation structures, the plurality of the heat dissipation structures being an integrated structure and being sandwiched together with the binding member to form an accommodation space for accommodating the driver chip.

19. The display device according to claim 13, further comprising:
a support layer arranged at one side of the driver chip away from the display member; and
a second bonding member configured to fix the support layer and the heat dissipation structure, the second bonding member including a heat conduction adhesive.

20. The display device according to claim 1, wherein a material of the first heat dissipation member includes at least one of copper and graphite.

* * * * *